United States Patent [19]

Iwahara

[11] 4,238,744
[45] * Dec. 9, 1980

[54] FREQUENCY BAND DIVIDING FILTER USING DELAY-LINE FILTER

[75] Inventor: Makoto Iwahara, Sagamihara, Japan

[73] Assignee: Victor Company of Japan, Ltd., Yokohama, Japan

[*] Notice: The portion of the term of this patent subsequent to Jan. 30, 1996, has been disclaimed.

[21] Appl. No.: 940,644

[22] Filed: Sep. 6, 1978

[30] Foreign Application Priority Data

Sep. 8, 1977 [JP] Japan .................................. 52-107196
Dec. 1, 1977 [JP] Japan .................................. 52-143286
Dec. 1, 1977 [JP] Japan .................................. 52-143287

[51] Int. Cl.³ ............................................. H03H 7/46
[52] U.S. Cl. ................................. 333/132; 328/139; 328/165; 328/167; 324/77 E
[58] Field of Search ............... 324/77 E; 333/132, 166; 328/167, 137, 139, 165; 330/126

[56] References Cited

U.S. PATENT DOCUMENTS

| 3,829,798 | 8/1974 | Byram et al. | 333/166 |
| 4,137,510 | 1/1979 | Iwahara | 328/139 |

Primary Examiner—Alfred E. Smith
Assistant Examiner—Thomas P. O'Hare
Attorney, Agent, or Firm—Haseltine, Lake & Waters

[57] ABSTRACT

A frequency band dividing filter comprises a delay-line filter which is supplied with an input signal and produces a divided frequency band signal as an output, a circuit for deriving a delayed signal in which the input signal has been delayed by a predetermined amount of time, and a circuit for substantially performing subtraction of the delayed signal output signal of the delay-line filter, and producing another divided frequency band output signal. The delay-line filter comprises a plurality of delay circuits cascade connected, coefficient multipliers respectively supplied with the input signal and the output signal of the delay circuits and for multiplying specific coefficients to the signals thus supplied, and an adder for adding output signals of each of the coefficient multipliers.

9 Claims, 18 Drawing Figures

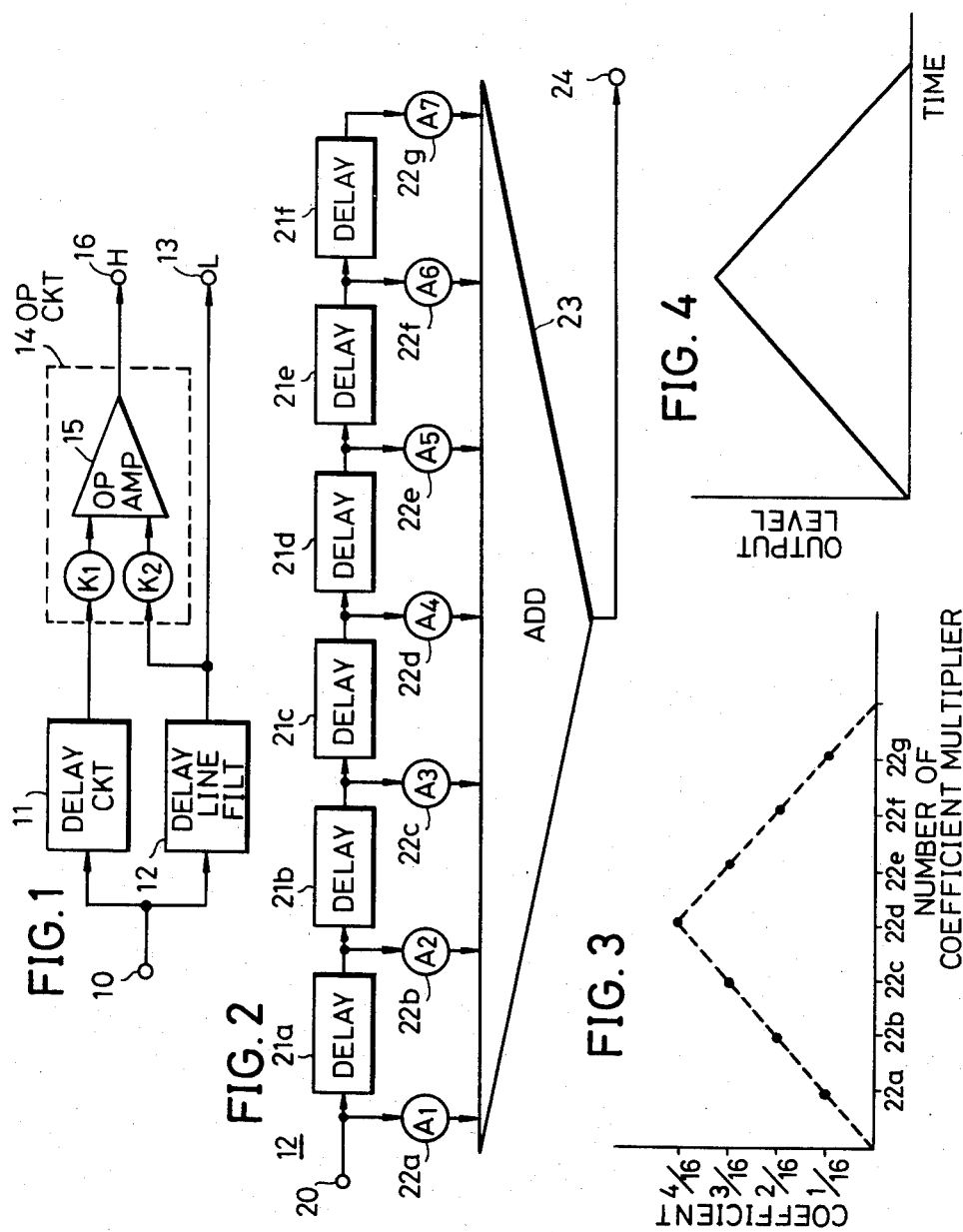

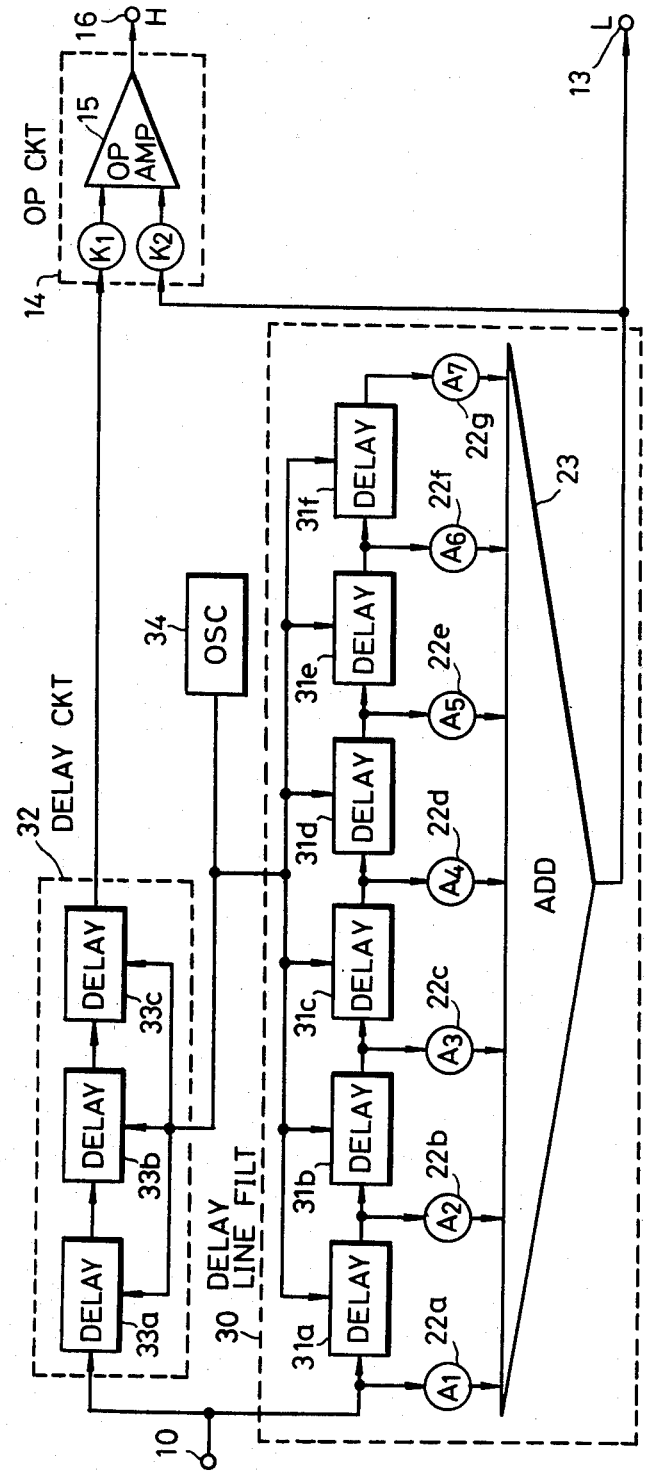

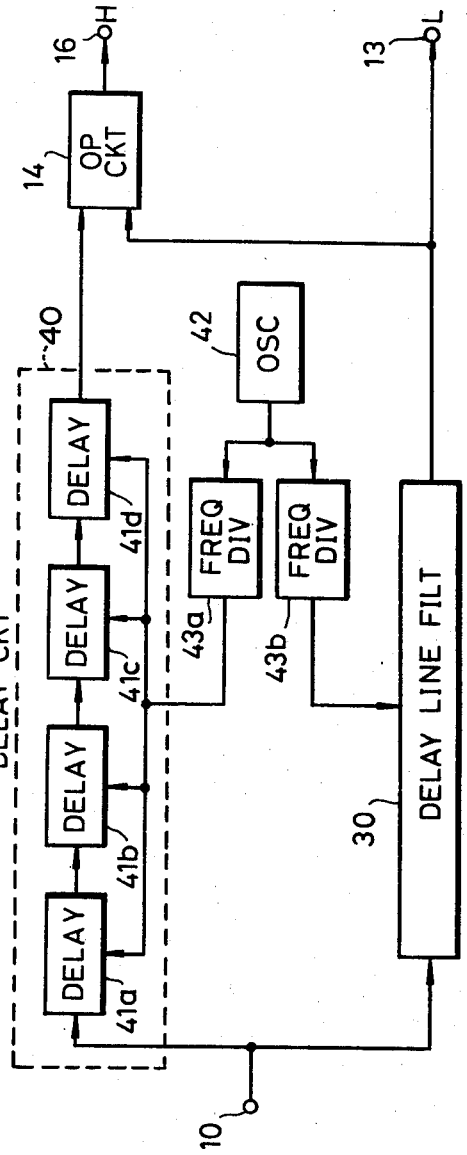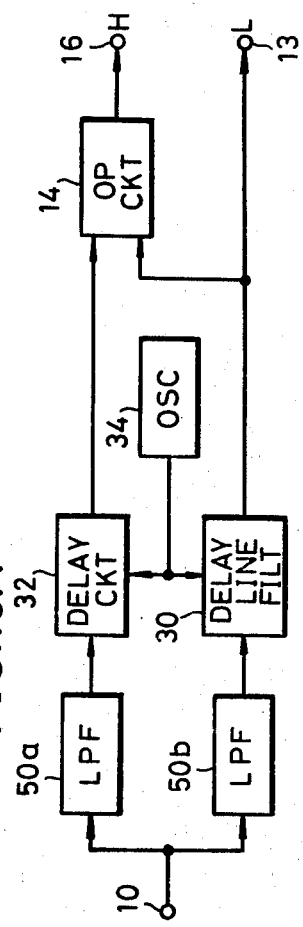

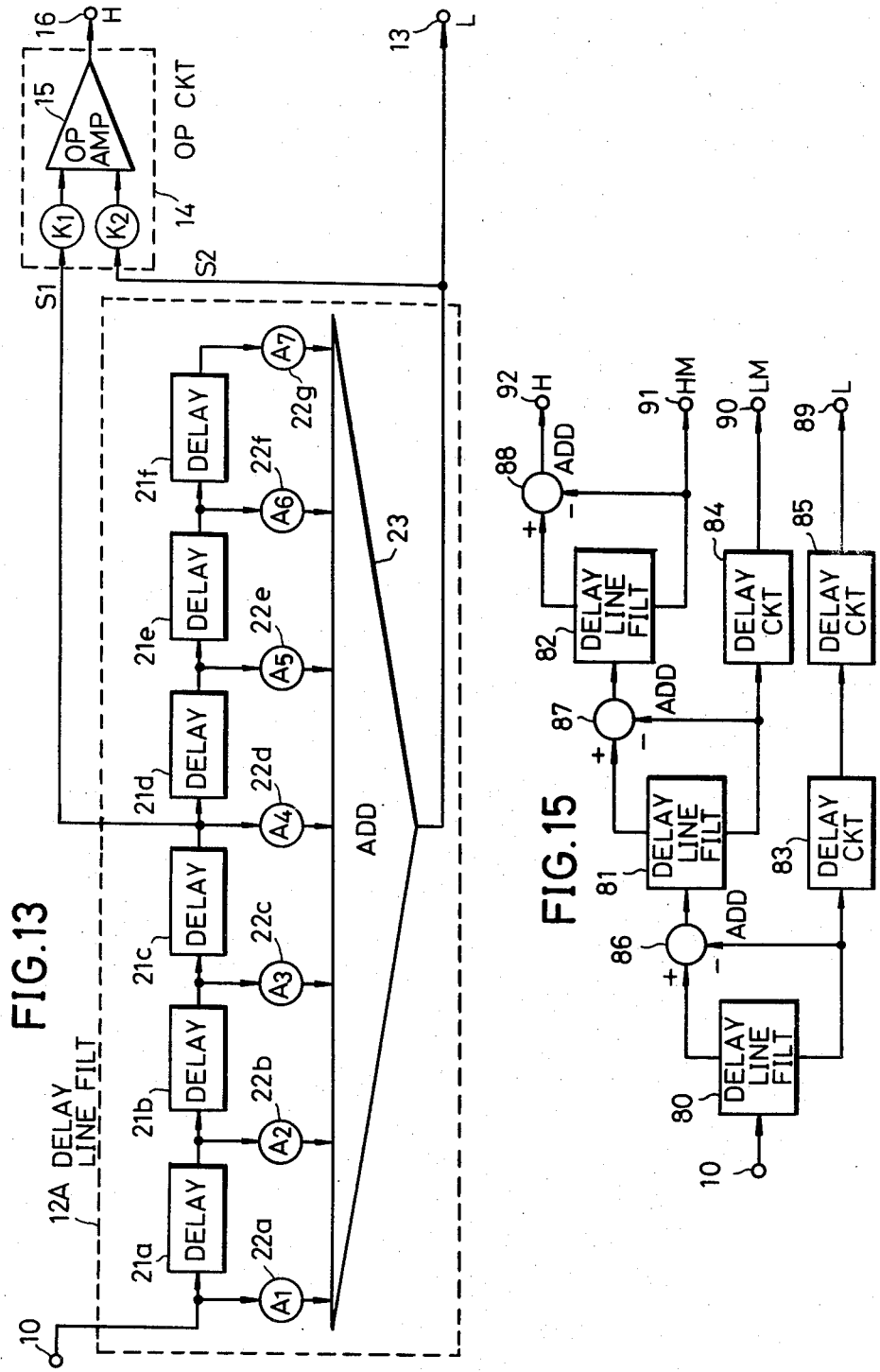

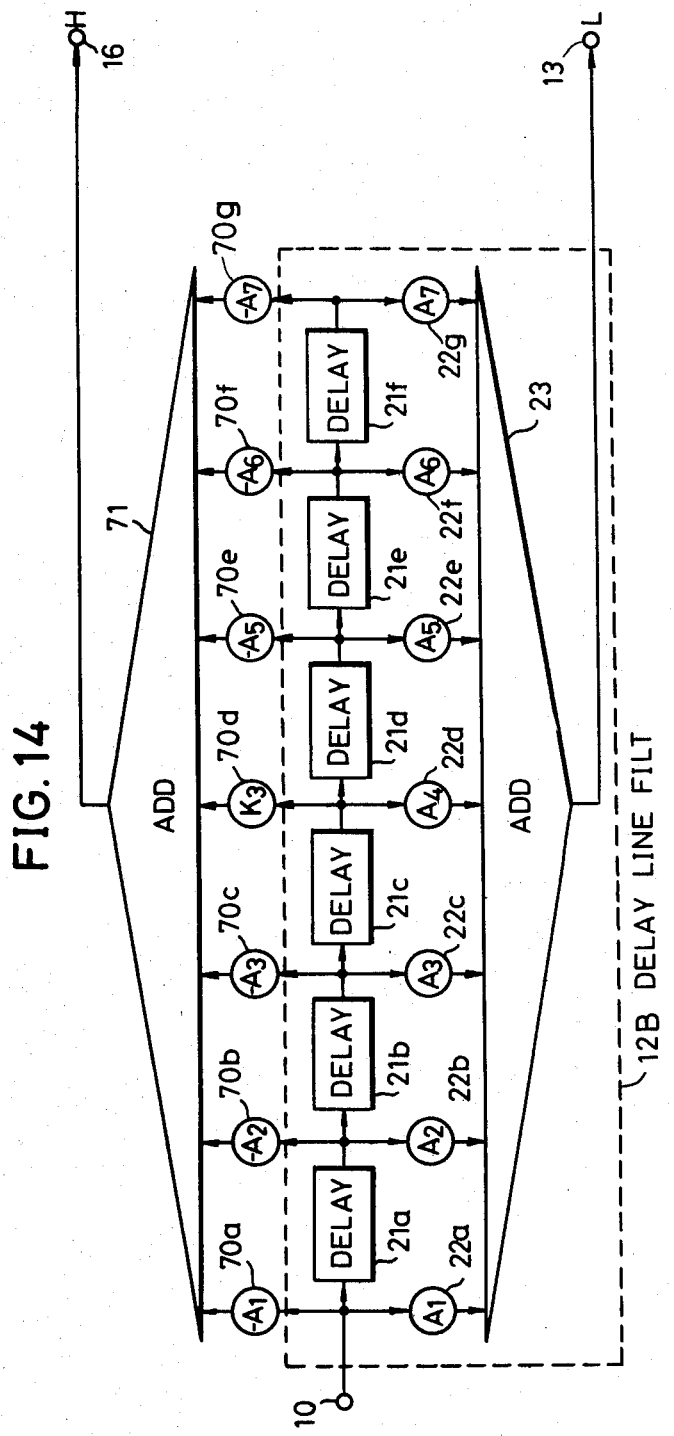

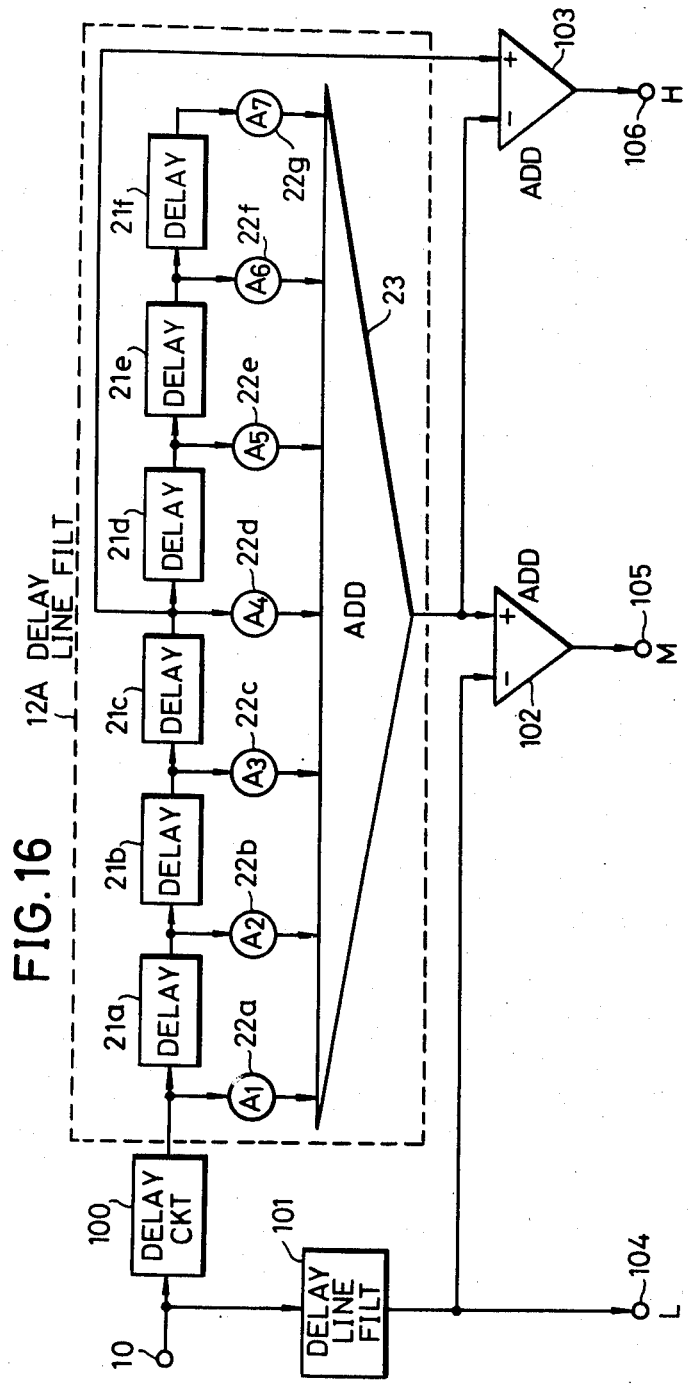

FREQUENCY BAND DIVIDING FILTER USING DELAY-LINE FILTER

BACKGROUND OF THE INVENTION

This invention relates generally to frequency band dividing filters using delay-line filters, and more particularly to a filter for the operation of frequency band dividing an input signal into band divided signals and then combining these signals into a combined signal, which filter includes delay-line filters having flat delay characteristics over the entire frequency range, thereby showing good cut-off characteristics, and operates to divide the input signal into a plurality of frequency band signals in a manner such that both the frequency amplitude characteristic and the frequency delay characteristic of the resulting combined signal will be flat.

In general, in a system such as an audio speaker system, there is a system in which speakers respectively for low, medium, and high frequency bands (hereinafter referred to as low, medium, and high bands), for example, are used, and an audio signal is divided into low, medium, and high bands, signals of the bands thus divided being supplied to the speakers for the respectively corresponding bands. For this band division, a frequency band dividing filter is used. In this case, the listener hears sounds resulting from the acoustical combination in the sound field of sounds reproduced by the speakers for the three bands. Furthermore, a system for dividing in this manner a signal into frequency bands, transmitting the signals thus divided through transmission systems respectively for the bands, and thereafter again adding and combining the signals thus transmitted thereby to obtain transmitted signals is being used also in systems such as a limiter or a noise reduction system.

In such cases, it is desirable that the characteristics of the signal obtained after being frequency band divided, transmitted, and then added and combined are equal to the characteristics of the signal prior to the frequency band division. Accordingly, a band dividing filter for accomplishing the above described frequency band division is required to have a sharp or steep cut-off characteristic and a frequency amplitude characteristic (hereinafter referred to as "amplitude characteristic") and a frequency delay characteristic (hereinafter referred to as "delay characteristic") such that the amplitude characteristic and the delay characteristic of the signal after adding and combining will respectively become flat.

However, in a typical frequency band dividing filter known heretofore, if any of the above mentioned cut-off characteristic, amplitude characteristic, and delay characteristic is as desired, the others are poor, and there have been none in which all of these characteristics are fully satisfactory.

Accordingly, the present applicant has previously proposed, in the specification of U.S. Pat. application, Ser. No. 888,561, filed Mar. 20, 1978, now U.S. Pat. No. 4,137,510 now allowed, a frequency band dividing filter capable of overcoming the difficulties accompanying the known frequency band dividing filters described above.

This proposed frequency band dividing filter comprises at least two unit circuits connected in cascade connection of at least two stages, and at least one supplemental delay circuit. Each of the unit circuits comprises a low-pass filter having a specific filtering frequency band with a steep cut-off characteristic, a delay circuit connected in parallel with the low-pass filter and having a frequency phase characteristic substantially equal to the frequency phase characteristic of said low-pass filter in the pass band thereof, and a subtraction circuit connected to the output sides of the low-pass filter and the delay circuit thereby to carry out subtraction of the outputs of the low-pass filter and the delay circuit. The supplemental delay circuit is connected in parallel with the second stage unit circuit, which is connected to the first stage unit circuit in cascade connection, and has the same characteristic as the characteristic of the delay circuit of the second stage unit circuit.

In accordance with this proposed frequency band dividing filter, the input signal can be so frequency band divided that, when the frequency band divided signals are combined, the frequency amplitude characteristic and the frequency delay characteristic of the combined signal are both flat. However, while this proposed frequency band dividing filter has an excellent cut-off characteristic particularly with respect to high frequencies, it entails a problem in that its delay characteristic is not constant throughout the full frequency band since the phase characteristic of the low-pass filter differs from that of the delay circuit.

SUMMARY OF THE INVENTION

Accordingly, it is a general object of the present invention to provide a novel and useful frequency band dividing filter in which the above described problems have been solved.

Another and specific object of the invention is to provide a frequency band dividing filter which is capable of so frequency band dividing an input signal that, when the frequency band divided signals are combined, the frequency amplitude characteristic and the frequency delay characteristic of the combined signal are both flat, and which, moreover, has a sharp cut-off characteristic. A feature of the frequency band dividing filter according to the invention is that, of the cut-off characteristics of the low-pass side and the high-pass side, that of the low-pass side is particularly excellent.

Still another object of the invention is to provide a frequency band dividing filter in which the crossover frequency of the filter band characteristics can be readily varied.

A further object of the invention is to provide a frequency band dividing filter in which a circuit capable of carrying out an operation of the above stated characteristics can be practically realized with a simple circuit organization.

Other object and further features of the invention will be apparent from a following detailed description when read in conjunction with the accompanying drawings.

BRIEF DESCRIPTION OF THE DRAWINGS

FIG. 1 is a block diagram showing a first embodiment of a frequency band dividing filter according to the invention;

FIG. 2 is a schematic circuit diagram showing a first embodiment of a delay-line filter in the block diagram illustrated in FIG. 1;

FIG. 3 is a graph indicating the relationship of values of coefficient of respective coefficient multipliers in the delay-line filter shown in FIG. 2;

FIG. 4 is a graph indicating an output waveform for a description of impulse response of the delay-line filter shown in FIG. 2;

FIG. 7 is a block diagram showing a second embodiment of the frequency band dividing filter according to the present invention;

FIG. 9 is a block diagram showing a third embodiment of a frequency band dividing filter according to the present invention;

FIG. 10A and FIG. 10B are block diagrams respectively showing a fourth embodiment of the frequency band dividing filter according to the present invention, and a modification thereof;

FIG. 12 through FIG. 16 are block diagrams respectively showing sixth through tenth embodiments of the frequency band dividing filter according to the present invention.

DETAILED DESCRIPTION

Figure 5:
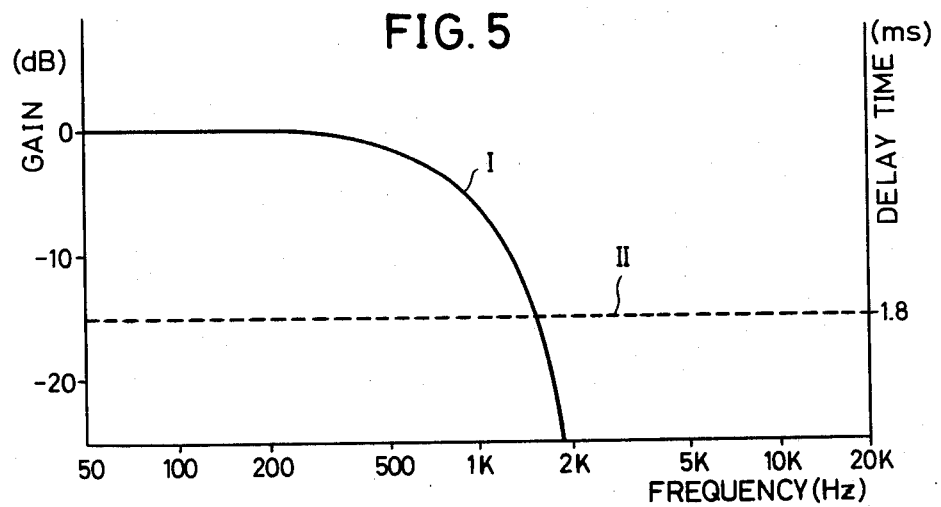
FIG. 5 is a graph indicating cut-off characteristic and delay characteristic of the delay-line filter shown in FIG. 2.

Referring first to FIG. 1 through FIG. 6, a first embodiment of a frequency band dividing filter according to the present invention will now be described. Referring to FIG. 1, an audio signal applied to an input terminal 10 is supplied to a delay circuit 11 and a delay-line filter (transversal filter) 12 which is described hereinafter.

A signal passed through the delay-line filter 12 is led out as a low band output signal L through the output terminal 13 and, at the same time, is supplied to a coefficient applying operation circuit 14, where it is multiplied by a coefficient K2, then being applied to an operational amplifier 15. On the other hand, a signal from the delay circuit 11 is multiplied by a coefficient K1 and then applied to the operational amplifier 15, where it is added to the above mentioned signal from the delay-line filter 12 which has been multiplied by the coefficient K2. Here, these coefficients K1 and K2 are set at K1=2 and K2=−1. Accordingly, the signals from the delay circuit 11 and the delay-line filter 12 of amplitude characteristics which are unequal with each other are subjected to have equal amplitude characteristics by applying the coefficients and subtracted in the operational amplifier 15 as signals of mutually substantially the same phase and the same level in the pass band of the delay-line filter 12. Therefore, a high band output H of sharp cut-off characteristic is led out through the output terminal 16.

One embodiment of the above described delay-line filter 12 according to the invention is shown in FIG. 2. This delay-line filter 12 comprises delay circuits 21a through 21f cascade connected to an input terminal 20, coefficient multipliers 22a through 22g branch-connected respectively to the input side of the delay circuit 21a and the output sides of the delay circuits 21a through 21f, and an adder 23 for adding the output signals of all coefficient multipliers 22a through 22g. The delay circuits 21a through 21f are constituted by electric charge transfer circuits which can be easily produced in the form of an integrated circuit, such as charge-coupled devices (CCD) or bucket-brigade devices (BBD), and the delay times between successive taps are set at the same value.

The coefficient multipliers 22a through 22g respectively comprise attenuators whose coefficients are determined by resistance values. The coefficients of these coefficient multipliers 22a through 22g are as indicated in FIG. 3. The coefficient of the center coefficient multiplier 22d is the maximum, and the coefficients of the other coefficient multipliers decrease progressively in succession toward the coefficient multipliers 22a and 22g at the two ends. These coefficients are so selected that the total of all coefficients is one (unity).

The signal applied to the input terminal 20 of the delay-line filter 12 is successively delayed in the delay circuits 21a through 21f and respectively multiplied by coefficients A1 through A7 in the coefficient multipliers 22a through 22g. The resulting signals are thereafter added in the adder 23. In the case where a signal such as, for example, an impulse signal, is applied to the input terminal 20, a signal of the waveform indicated in FIG. 4 is obtained through the output terminal 24 of the adder 23. This waveform is equal to a waveform represented by lines joining the values of all successive coefficients when, in the graph indicating the coefficient relationships in FIG. 3, the abscissa and the ordinate are respectively substituted by time and output.

The frequency-versus-gain characteristic of the delay-line filter exhibiting an impulse response of this character is as indicated by curve I in FIG. 5. It is to be observed that, in the low-frequency band (for example, less than approximately 300 Hz), there is almost no phase difference between the two end terminals of each of the delay circuits 21a through 21f, and the gain is of a value substantially equal to the sum of the coefficients, that is, 1 (0 dB), while above 300 Hz, the phase difference of the outputs of the taps becomes large, and the gain decreases progressively as the frequency increases. In addition, the frequency-versus-delay characteristic of this delay-line filter 12 is as indicated by straight line II in FIG. 5, and the delay time is constant (for example, 1.8 msec.), being unrelated to the frequency band.

As is apparent from this, the delay-line filter 12 shown in FIG. 2 operates as a low-pass filter having a constant delay time over substantially the total frequency band. By the use of this delay-line filter 12, a delay time characteristic which is more constant than that of only a known low-pass filter or that of cascade-connected circuit of a low-pass filter and a phase-shifting circuit can be obtained, and this delay time characteristic becomes the same as the delay characteristic of the delay circuit 11, which, in general, is constant over the entire frequency band.

In the embodiment of the invention illustrated in FIG. 2, the number of taps is selected at 7 for the sake of simplicity of illustration, but in actual practice, it is necessary to use approximately 150 taps and to set the delay time between taps at less than 25 μsec. in order to obtain a characteristic as indicated in FIG. 5. In this case, it is necessary that the delay time between the taps be amply shorter than the period of maximum high frequency being handled. Furthermore, the cut-off frequency can be further lowered by further increasing the number of taps.

Here, by setting at least the phase characteristic of the phase and amplitude characteristics of the delay-line filter 12 substantially equal to the phase characteristic of the delay circuit 11 in at least the pass band of the frequency pass band and the cut-off frequency thereof, the output signals of the delay circuit 11 and the delay-line filter 12 are subjected effectively to operation in the operation circuit 14.

Figure 6:
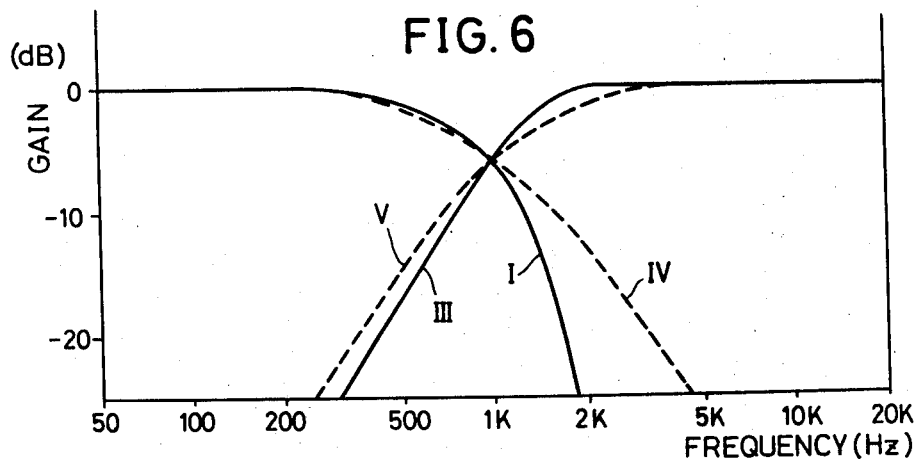
FIG. 6 is a graph indicating a cut-off characteristic of the frequency band dividing filter indicated in FIG. 1.

Accordingly, the cut-off characteristics on the low-frequency side and the high-frequency side of the frequency band dividing filter according to the present invention become as indicated by curves I and III in FIG. 6 and are superior to the cut-off characteristics on the low-frequency and high-frequency sides respectively indicated by curves IV and V of the aforementioned frequency band dividing filter previously proposed in U.S. Pat. application Ser. No. 888,561, now U.S. Pat. No. 4,137,510. It is apparent that particularly the cut-off characteristic on the low-frequency side is remarkably improved.

When the signal of the characteristic LP from the output terminal 13 and the signal of the characteristic (D−LP) from the output terminal 16 are combined, the characteristic of the combined signal becomes LP+(D−LP)=D. Thus, the characteristic of the combined signal is represented by only the characteristic D of the delay circuit 11, whose amplitude characteristic and group delay characteristic are both flat, and is unrelated to the characteristic LP of the delay-line filter 12. Therefore, no matter what characteristic the delay-line filter used for the filter 12 has, a combined signal whose amplitude and group delay characteristics are both flat will be obtained.

The delay-line filter 2 can be used not only in the frequency band dividing filter of the organization shown in FIG. 1 but also in place of the low-pass filters in the various embodiments of the frequency band dividing filter proposed in the above mentioned U.S. Pat. application Ser. No. 888,561, now U.S. Pat. No. 4,137,510. In this case, however, it is not necessary to replace all of the low-pass filters with the delay-line filter of the present invention, and the low-pass filters with respect to particular channels in which sharp cut-off characteristics are desired may be thus replaced.

Furthermore, the impulse response output of the delay-line filter is not necessarily limited to the triangular wave pulse indicated in FIG. 4 of the above described embodiment of the invention but may be of a waveform such as a raised cosine pulse or a rectangular wave pulse in accordance with the objective filter characteristics and can be selected as desired by appropriately setting the coefficients of the coefficient multipliers 22a through 22g of the delay-line filter 12.

In the embodiment of the invention described above and illustrated by FIG. 2, the delay-line filter 12 has the organization of an non-recursive type (also called a transversal type) which does not include a feedback loop, but it may have the organization of a recursive type depending on the objective filter characteristics.

In the case where signals obtained by band dividing by means of a frequency band dividing filter is supplied to a multiway loudspeaker system, it is desirable that the crossover frequency of the band division be appropriately and adjustably variable in accordance with the loudspeaker units used. An embodiment of the invention designed to satisfy this requirement will now be described.

In the second embodiment of the frequency band dividing filter of the invention as illustrated in FIG. 7, those parts which are the same as corresponding parts in FIGS. 1 and 2 are designated by like reference numerals. Description of such parts will be omitted.

A delay circuit 32 comprises cascade connected delay circuits 33a, 33b, and 33c similar to delay circuits 31a through 31f of a delay-line filter 30. The delay circuits 31a through 31f and 33a, 33b, and 33c are supplied with clock pulses from a clock signal oscillator 34 and delay the input signal with a delay time responsive to the frequency of this clock signal. In the illustrated embodiment of the invention, the coefficient of the coefficient multiplier 22d of the delay-line filter 30 is set at the maximum value. For this reason, in the case where the number of stages of the relay circuits (31a through 31f) of the delay-line filter 30 is 6, by setting the number of stages of the relay circuits (33a through 33c) of the delay circuit 32 at 3, the delay quantities of the delay-line filter 30 and the delay circuit 32 can be made equal, and operation of signals of equal delay quantity is accomplished in the operation circuit 14.

The clock signal oscillator 34 comprises a multivibrator to which a variable resistor is connected, and the output oscillation frequency thereof is varied by the variable adjustment of this variable resistor. As a result of variation of the output oscillation frequency of the oscillator 34, the delay times of the delay circuits 31a through 31f and 33a, 33b, and 33c are uniformly varied. The frequency-delay characteristics of the delay-line filter 30 and the delay circuit 32 at this time vary in inverse proportion to the clock signal frequency. Furthermore, the slope of the frequency-amplitude characteristic of the delay-line filter does not change, and the cut-off frequency thereof varies in proportion to the clock signal frequency.

Figure 8:
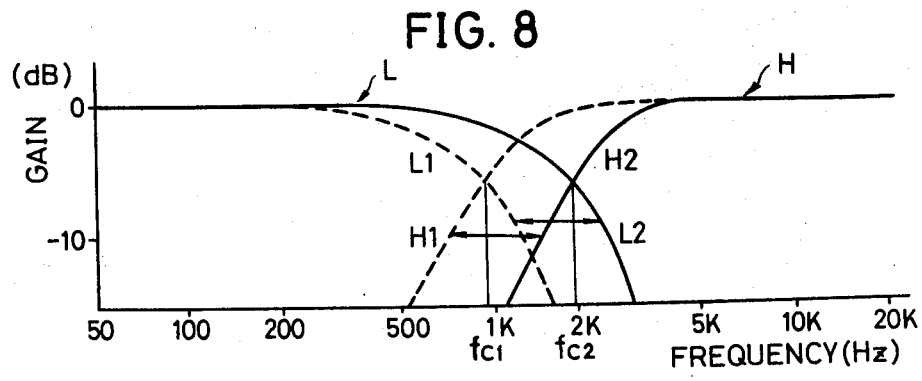
FIG. 8 is a graph indicating a changing state of cut-off characteristic in the case of variably changing a clock signal frequency for the frequency band dividing filter shown in FIG. 7.

For this reason, when the delay times of the delay-line filter 30 and the delay circuit 32 are caused to vary with the same ratio, the operation in the operation circuit 14 becomes a subtraction between signals whose delay characteristics (phase characteristics) have been equally varied, and the cut-off frequencies of the frequency-amplitude characteristics thereof vary in proportion to the clock signal frequency as indicated by L1–L2 and H1–H2 in FIG. 8. Accordingly, the crossover frequency of the two cut-off characteristics varies as fc 1–fc2. The characteristics L2 and H2 indicated in FIG. 8 are characteristics obtained through the use of clock signals of frequencies which are twice the clock frequencies by which the characteristics L1 and H1 are obtained.

A third embodiment of the frequency band dividing filter according to the invention is illustrated in FIG. 9, in which those parts which are the same as corresponding parts in FIG. 7 are designated by like reference numerals.

In the case where the above described delay circuit 32 and the delay-line filter 30 are consitituted by an IC comprising a BBD or a CCD, and a IC sold on the market is used, the number of stages of the delay circuit 32 and the number of stages of delay circuits of the delay-line filter 30 do not necessarily assume a specific ratio. Therefore, in the present embodiment of the invention, this problem is solved as follows. In the case where, for example, the use of a delay circuit 40 comprising delay circuits 41a through 41d 4 stages as indicated in FIG. 9 in place of the delay circuit 32 capable of obtaining the required delay quantities with the delay circuits 33a, 33b, and 33c of 3 stages shown in FIG. 7 cannot be avoided, frequency dividers 43a and 43b are used.

A clock signal oscillator 42 oscillating with a frequency which is four times the oscillation frequency of the oscillator 34 shown in FIG. 7 is used. The oscillation output of this oscillator 42 is frequently divided into ⅓ in the frequency divider 43a and then supplied to the delay circuit 40. The oscillation output of the oscillator 42 is also frequency divided into ¼ in the frequency divider 43b and then supplied to the delay-line filter 30. Since the number of stages of the delay circuit 40 is ¾ times that of the delay circuit 32, and the supplied clock signal frequency is 4/3 times, the delay time obtained by the delay circuit 40, as the ultimate result, becomes the same as that of the delay circuit 32. Furthermore, the frequency of the clock signal supplied to the delay-line filter 30 is the same as that in the above described preceding embodiment of the invention. Accordingly, an effective result which is the same as that of the circuit of FIG. 7 can be obtained by the circuit of FIG. 9. Furthermore, by varying the oscillation frequency of the clock signal oscillator 42, the crossover frequency can be varied similarly as in the preceding embodiment of the invention.

In the case where delaying is carried out with a clock signal, a distortion will be produced in the output if a signal of a frequency corresponding to a frequency higher than ½ of the clock signal frequency is included in the input signal. More specifically, in the case where an audio signal of a frequency of 20 Hz to 20 KHz is to be handled, in general, there will be no problem if the clock signal frequency is set at a value higher than 40 KHz. However, in the case of application to an FM stereo broadcast receiver, a distortion is produced since a carrier signal of a frequency of 38 KHz is included in the signal.

Figure 10B:
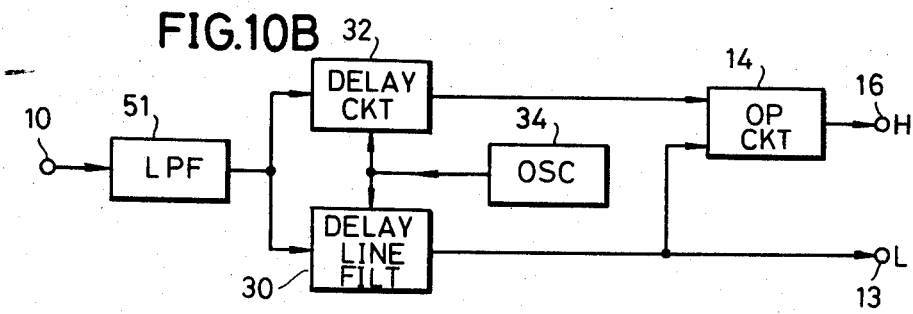

This problem can be solved according to the present invention, nevertheless, by connecting low-pass filters 50a and 50b of mutually the same characteristics for respectively removing carrier signals of the above mentioned 38 KHz to the input sides of the delay circuit 32 and the delay-line filter 30 shown in FIG. 10A. Furthermore, as illustrated in FIG. 10B, a single low-pass filter 51 may be connected commonly to the input sides of the delay circuit 32 and the delay-line filter 30. By this expedient, a signal which is free of distortion due to carrier signals can be derived.

Figure 11A:
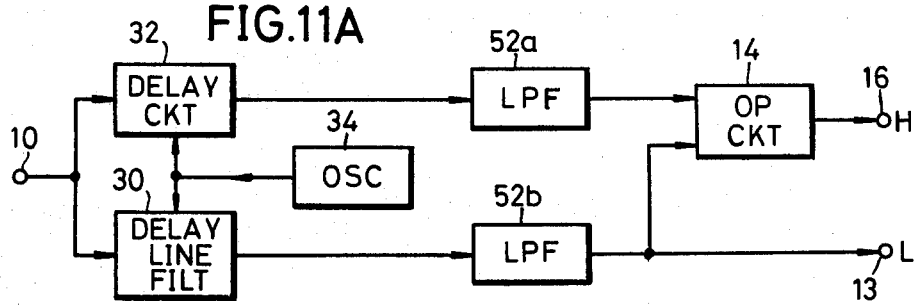
FIG. 11A and FIG. 11B are block diagrams respectively showing a fifth embodiment of a frequency band dividing filter according to the present invention, and a modification thereof.
Figure 11B:
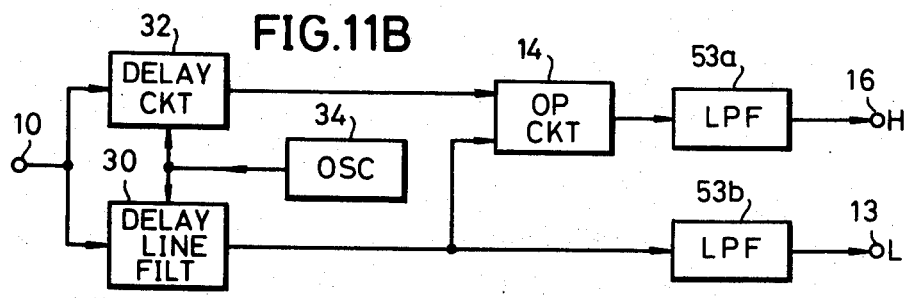

In addition, in the case of effecting delay by using clock signals, clock signals are included, in general, in the outputs of the delay circuits. Here, when the clock signal frequency is higher than the audible sound frequency band, it cannot be heard, but it is desirable to remove beforehand the clock signal component within the output signal. This can be accomplished in this case, as shown in FIG. 11A, by connecting low-pass filters 52a and 52b for filtering signal components of bands below the clock signal frequency, which have mutually the same characteristics, to the output sides of the delay circuit 32 and the delay-line filter 30. Furthermore, as an example of modification thereof, low-pass filters 53a and 53b may be connected in front of the output terminals 16 and 13 as shown in FIG. 11B.

Figure 12:
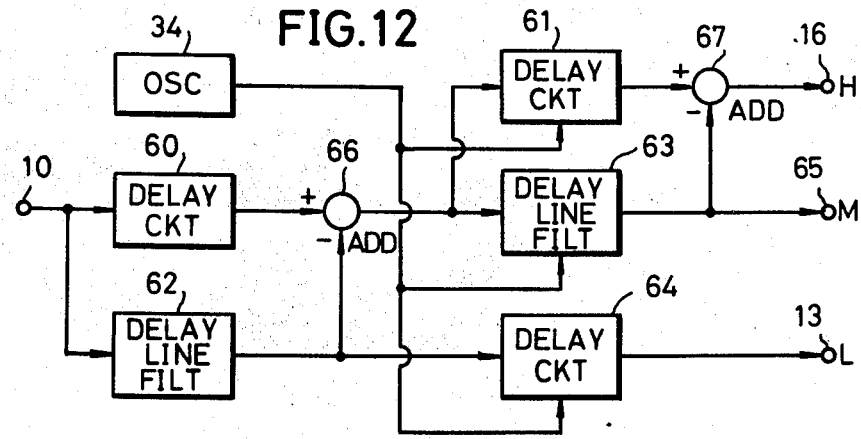

An embodiment indicated in FIG. 12 is adapted to divide the input signal into three frequency bands. Various characteristics of respective groups of delay circuits 60 and 61, and delay-line filters 62 and 63 are set similarly as characteristics of the frequency band dividing filter indicated in FIG. 7. The phase characteristic of a delay circuit 64 is set so as to be the same as the phase characteristic of the combined signal of the output signals of a filter consisting of the delay circuit 61 and the delay-line filter 63. The delay circuit 61, the delay-line filter 63, and the delay circuit 64 are respectively supplied with the oscillation output clock pulse from the clock signal oscillator 34.

The output of the delay-line filter 62 passes, on one hand, through the delay circuit 64, and is let out as low band output from the output terminal 13. The output of the delay-line filter 62 is, on the other hand, supplied together with the output of the delay circuit 60 to an adder 66, where they are subjected to addition (in actual, subtraction).

The output of the adder 66 passes, on one hand, through the delay-line filter 63, and is led out as a middle band output through an output terminal 65. The output of the delay-line filter 63 is, on the other hand, supplied to an adder 67, where it is added with (in actual, subtracted from) the output of the adder 66, which output has passed through the delay circuit 61. The output of the adder 67 is led out s a high band output signal through the output terminal 16.

In the present embodiment, when the oscillation frequency of the oscillator 34 is changed variably, the crossover frequency of filtration bands of high band frequency signal and middle band frequency signal respectively led out through the output terminals 16 and 65 will be variably changed, in response to the oscillation frequency thus changed.

A circuit organization wherein the output of the clock signal oscillator 34 is supplied to the delay circuit 60 and the delay-line circuit 62 may be used.

Next, a description is given of respective embodiments in which circuit organization of the above described embodiments is further simplified. In the embodiment described hereinafter, the delay circuit elements in the delay circuit and the delay circuit elements in the delay-line filter in the embodiment described hereinbefore are used in common.

In the embodiment indicated in FIG. 13, parts which correspond to those in FIG. 1 and FIG. 2 are designated by like reference numerals. The audio signal applied to the input terminal 10 is supplied to a delay-line filter 12A, and the low band output signal L is obtained from the output side of the adder 23 and through the output terminal 13. The output signal S2 of the delay-line filter 12A is, on the other hand, supplied to the operation circuit 14, where it is multiplied by the coefficient K2, and is then fed to the operational amplifier 15.

On the other hand, the output signal S1 of the delay circuit 21c in the delay-line filter 12A is supplied to the delay circuit 21d and the coefficient multiplier 22d, and further to the operation circuit 14 where it is multiplied by the coefficient K1 and is then applied to the operational amplifier 15. Accordingly, the high band output signal H is obtained from the operation circuit 14 through the output terminal 16. The operation circuit 14 carries out an operation in such a manner that two signals S1 and S2 from the above described delay-line filter 12A are respectively multiplied by the coefficients K1 and K2, and the output thereby becomes zero substantially in the pass band of the delay-line filter 12A.

According to the present embodiment, since the delay circuits 21a through 21c included in the delay-line filter 12A also serve as the delay circuit 11 in the first embodiment, the delay circuit 11 can be eliminated, thereby affording simple circuit organization.

FIG. 14 shows a circuit of an embodiment which is arranged in such a manner that signals which are the same as the output signals H and L obtained on the assumption that the coefficients K1 and K2 of the operation circuit 14 in FIG. 13 are respectively set to +1 and -1 are obtained. Parts in FIG. 14 which correspond to those in FIG. 2 are designated by like reference numerals.

The signals supplied to the coefficient multipliers 22a through 22g in the delay-line filter 12B are, on the other hand, supplied to other coefficient multipliers 70a through 70g from the delay-line filter 12B. Coefficients of the coefficient multipliers 70a through 70c and 70e through 70g are respectively coefficients −A1 through −A3 and −A5 through −A7 which are coefficients with minus sign of the coefficient multipliers having the corresponding subscript among the coefficient multipliers 22a through 22c and 22e through 22g. The coefficient K3 of the coefficient multiplier 70d are set to a value equal to (1 - coefficient A4 of the coefficient multiplier 22d). In the case where the coefficient A4 of the coefficient multipler 22d is 4/16 as indicated in FIG. 3, the coefficient K3 assumes ¾.

From the output terminal 13, there is derived the output signal of the delay-line filter 12B as a low band output signal, similarly as in the preceding embodiment. On the other hand, the signals which have been multiplied by each coefficient in the coefficient multipliers 70a through 70g are added in the adder 71. Here, since the coefficients of the coefficient multipliers 70a through 70c, and 70e through 70g are respectively −A1 through −A3, (1−A4), and −A5 through −A7, the adder 71 actually performs operation of subtracting the signal obtained from the adder 23 from the signal derived from a connection point of the delay circuits 21c and 21d.

Accordingly, according to the present embodiment, the delay circuits 21a through 21g which also serve as delay-line filter 12B, the coefficient multipliers 70a through 70g, and the adder 71 perform operation which is substantially equivalent to that of operation circuit of substracting the output signal of the delay circuit 21c from the output signal of the delay-line filter 12B, as in the embodiment indicated in FIG. 13.

FIG. 15 shows an embodiment of a construction in which a plurality of circuits indicated in FIG. 13, as a fundamental unit circuit, are cascade connected so as to divide the input signal into four frequency bands.

The output signal of a delay-line filter 80 which is constructed similarly as the delay-line filter 12A illustrated in FIG. 13 and the signal derived from an intermediate stage of the delay-line filter 80 are supplied to an adder 86, where they are added together (or subtracted). The output signal of the adder 86 is supplied to a delay-line filter 81. The output signal of the delay-line filter 81 and the signal derived from an intermediate stage of the delay-line filter 81 are supplied to an adder 87. The output signal of the adder 86 is fed to the delay-line filter 82, and the output signal of the delay-line ilter 82 and the signal derived from an intermediate stage of the delay-line filter 82 are supplied to an adder 88. The output signal of the adder 88 is led out as a high band output signal H through an output terminal 92. The output signal of the delay-line filter 82 is led out as a middle and high output signal HM through an output terminal 91. The output signal of the delay-line filter 81 passes through a delay circuit 84 and is then led out as a middle and low output signal LM through an output terminal 90. The output of the delay-line filter 80 passes through the delay circuits 83 and 85, and is then led out as a low band output signal L through an output terminal 89. It is to be noted that the phase characteristic of the delay circuit 83 is set so as to be equal to the phase characteristic of a two-dividing filter consisting of the delay-line filter 81 and the adder 87, and that the phase characteristics of the delay circuits 84 and 85 are respectively set so as to be equal to the phase characteristic of a two-dividing filter consisting of the delay-line filter 82 and the adder 88.

An embodiment of a construction which uses the circuits indicated in FIG. 13 and is adapted to divide the input signal into three frequency bands is indicated in FIG. 16. The input signal applied to the input terminal 10 is supplied to a delay-line filter 101 having a circuit organization as indicated in FIG. 2, and, at the same time, is supplied to the delay-line filter 12A by way of a delay circuit 100. The output of the delay-line filter 101 is led out as a low band output signal L through an output terminal 104, and, simultaneously, is supplied to an adder 102. The output of the adder 23 in the delay-line filter 12A is supplied to the adder 102 and an adder 103. The resulting output of the adder 102 is led out as a middle band output signal M through an output terminal 105. The output signal of the delay circuit 21c in the delay-line filter 12A is supplied to the adder 103, and the output signal of the adder 103 is led out as a high band output signal H through an output terminal 106.

Furthermore, as a modification of the present embodiment, the delay-line filter 12A may be used instead of the delay-line filter 101 and the delay circuit 100.

Further, this invention is not limited to those embodiments but various variation and modifications may be made without departing from the scope of the invention.

What is claimed is:

1. A frequency band dividing filter comprising:
   a delay-line filter supplied with an input signal, said delay-line filter producing a divided frequency band signal as an output;
   means for deriving a delayed signal in which said input signal has been delayed by a predetermined amount of time; and
   means for substantially performing subtraction of the delayed signal and the output signal of said delay-line filter, and producing another divided frequency band output signal,
said delay-line filter comprising a plurality of delay circuits cascade connected, coefficient multipliers respectively supplied with said input signal and the output signal of said delay circuits and for multiplying specific coefficients to said signals thus supplied, and an adder for adding output signals of each of said coefficient multipliers.

2. A frequency band dividing filter as claimed in claim 1 in which said means for deriving said delayed signal comprises a delay circuit having a frequency phase characteristic which is substantially equal to a frequency phase characteristic of said delay-line filter for a passing frequency band thereof.

3. A frequency band dividing filter as claimed in claim 1 in which coefficients of respective coefficient multipliers in said delay-line filter are so set that a coefficient of the coefficient multiplier at the center position in a circuit arrangement has a maximum value and coefficients of the other coefficient multipliers become smaller as they are disposed near the opposite ends of the circuit arrangement.

4. A frequency band dividing filter as claimed in claim 1 in which said delay circuits of said delay-line filter comprise a first group of delay circuits delaying amount of which are variably changed in response to a clock signal, and said means for obtaining delayed signal comprises a second group of delay circuits cascade connected and subjected to change delaying amount thereof in response to the clock signal, and which further comprises an oscillator for supplying oscillation output thereof as the clock signal to each of delay circuits of said first and second groups of delay circuits, said oscillator being adapted to change oscillation frequency thereof.

5. A frequency band dividing filter as claimed in claim 4 which further comprises a first frequency divider for frequency dividing the output signal of said oscillator in a first frequency division ratio and for supplying the resulting frequency divided output thereof as the clock signal to each of delay circuits of said first group, and a second frequency divider for frequency dividing the output signal of said oscillator in a second frequency division ratio which is different from said first frequency division ratio and is determined in compliance with the number of delay circuits of said second group of delay circuits and for supplying the resulting frequency divided output as the clock signal to each of delay circuits of said second group.

6. A frequency band dividing filter as claimed in claim 4 which further comprises at least one low-pass filter connected at a stage preceding to said first group and second group of delay circuits, said low-pass filter having a filtration characteristic for eliminating frequency components near said clock signal frequency among said input signal.

7. A frequency band dividing filter as claimed in claim 4 whih further comprises low-pass filters connected at a stage succeeding said first group and second group of delay circuits, said each low-pass filter having a filtration characteristic for eliminating a component of said clock signal frequency.

8. A frequency band dividing filter as claimed in claim 1 in which said means for deriving the delayed signal is adapted to derive a signal delayed by a specific number of delay circuits from an intermediate position of the delay circuits cascade connected in said delay-line filter.

9. A frequency band dividing filter as claimed in claim 1 in which said subtraction means comprises coefficient multipliers for multiplying coefficients $-A1$ through $-Ai$ and $-Ak$ through $-Ax$ which respectively correspond to coefficients $A1$ through $Ai$ and $Ak$ through $Ax$ with minus sign of coefficient multipliers of said delay-line filter, a coefficient multiplier for multiplying a coefficient $(1-Aj)$ in correspondence with a coefficient $Aj$ of a coefficient multiplier of said delay-line filter, and an adder for adding the resulting outputs of said coefficient multipliers.

* * * * *